United States Patent [19]

Chrobak et al.

[11] Patent Number: 4,635,354
[45] Date of Patent: Jan. 13, 1987

[54] LOW COST ELECTRONIC APPARATUS CONSTRUCTION METHOD

[75] Inventors: Michael J. Chrobak; Doyle R. Evans, both of Lubbock, Tex.

[73] Assignee: Texas Instruments Incorporated, Dallas, Tex.

[21] Appl. No.: 702,755

[22] Filed: Feb. 19, 1985

Related U.S. Application Data

[63] Continuation of Ser. No. 401,053, Jul. 22, 1982, abandoned.

[51] Int. Cl.⁴ .................................................. H01H 11/00
[52] U.S. Cl. ...................................... 29/622; 29/834; 174/52 P; 228/180.2; 101/163; 361/404; 361/411
[58] Field of Search ........................... 29/622, 832–836, 29/854–856, 868–873; 364/708; 361/399, 401, 361/402, 400, 404–406, 411; 174/52 P; 228/179, 228/180.2; 427/96; 101/150, 154, 163; 339/17 CF, 339/17 C, 48, 49 B

[56] References Cited

U.S. PATENT DOCUMENTS

| | | | |
|---|---|---|---|
| 3,148,356 | 9/1964 | Hedden, Jr. | 339/17 CF |
| 3,192,307 | 6/1965 | Lazar | 339/17 CF |
| 3,346,689 | 10/1967 | Parstorfer | 361/411 |
| 3,609,758 | 9/1971 | Buesing | 200/5 A |
| 3,614,832 | 10/1971 | Chance et al. | 228/180.2 |
| 4,118,858 | 10/1978 | Taylor, Jr. et al. | 29/622 |
| 4,231,098 | 10/1980 | Tanimoto | 364/708 |
| 4,356,505 | 10/1982 | Lovinger et al. | 357/72 |
| 4,380,357 | 4/1983 | Evans et al. | 339/17 CF |
| 4,457,721 | 7/1984 | Charvolin | 339/17 C |

Primary Examiner—Howard N. Goldberg
Assistant Examiner—P. W. Echols
Attorney, Agent, or Firm—William E. Hiller; Leo N. Heiting; Melvin Sharp

[57] ABSTRACT

The present invention is a low cost electronic apparatus construction method which may be employed for hand held calculators, electronic learning aids and electronic games. This technique involves a simplification in the construction of the apparatus including reduction in the number of piece parts necessary for the assembly. The primary electrical circuit interconnection pattern of the electronic apparatus is printed upon a part of the case of the apparatus which must be nonconducting. This printed circuit pattern together with the construction of the back case includes connection portions for electrical connection to the major components of the apparatus which may include an integrated circuit, a display device and an electrical power source. The primary circuit pattern printed on the back case includes a plurality of interleaved comb key switch positions. The keyboard is constructed employing a plurality of keys aligned in registration with the key switch portions, each key having a shorting bar for causing electrical connection across the key switch portion when the key is depressed. The top case of the apparatus has an aperture for viewing the display device and a plurality of apertures for the keys. In an alternative embodiment, this top case also includes an aperture enabling light to shine on a photovoltaic power cell employed to generate the electric power needed to operate the apparatus.

14 Claims, 16 Drawing Figures

LOW COST ELECTRONIC APPARATUS CONSTRUCTION METHOD

This is a continuation of application Ser. No. 401,053, filed July 22, 1982, now abandoned.

BACKGROUND OF THE INVENTION

The present invention falls within the field of construction of electronic apparatuses such as hand held calculators, electronic learning aids and hand held electronic games. Construction of apparatuses of this type was disclosed in U.S. Pat. No. 3,819,921 "Miniature Electronic Calculator" issued to Jack S. Kilby, Jerry D. Merryman and James H. Van Tassel on June 25, 1974. This patent discloses a hand held calculator including a keyboard input means, a visual display device and an integrated semiconductor circuit array located in substantially one plane including memory for storing entered digits, an arithmetic unit for performing calculations and a control unit controlling the transfer of data from the memory to the arithmetic unit and back to the memory.

Since the innovation described in U.S. Pat. No. 3,819,921 major improvements in the computational ability and reductions in the cost of such apparatuses have been achieved. Heretofore such advances in the art of manufacture of miniature electronic apparatuses have come about due to improvements in the semiconductor art, specifically improvements in the complexity and reductions in the cost of integrated circuit semiconductor devices which form the primary electrical component of such apparatuses. Such innovations are exemplified by U.S. Pat. No. 4,074,351 "Variable Function Programmed Calculator" issued to Gary W. Boone and Michael H. Cochran on Feb. 14, 1978, which discloses an improved integrated circuit such as employed in apparatuses of this type. U.S. Pat. No. 4,326,265 "Variable Function Programmed Calculator" issued to Gary W. Boone on Apr. 20, 1982 discloses an electronic system which advantageously employs the integrated circuit taught in U.S. Pat. No. 4,074,351.

The improvements in the semiconductor integrated circuit exemplified by the above cited patents have resulted in revolutionary improvements in apparatuses of this type. However, further improvements in semiconductor electronic technology presently yield decreasing benefits in the complexity and cost of such apparatuses, particularly in the field of low cost apparatuses. As a result, further decreases in cost will now become more dependent upon improvements in the manufacturability of these apparatuses. This is because improvements in integrated circuit technology have proceeded at such a rapid pace that this area of the apparatus assumes a decreasing proportion of the total cost of manufacture. Thus improvements in the manufacturability of such apparatuses assume a corresponding increasing importance in the total cost of such an electronic apparatus.

SUMMARY OF THE INVENTION

It is an object of the present invention to provide a low cost electronic apparatus assembly method, this assembly method including few piece parts and specifically adapted for substantially automated assembly.

In order to achieve the above noted object of the present invention, the major circuit interconnection of the electronic apparatus is provided on a part of the case of the apparatus via a transfer printing process. In the preferred embodiment this major circuit interconnection is printed on the interior surface of the bottom case of the apparatus, however other portions of the case, such as the top case, may be employed. Of course the surface upon which the interconnection pattern is formed must be nonconducting. This interconnection pattern preferably has connection portions for coupling to the major electrical components of the apparatus. These major electrical components include an integrated circuit semiconductor device, a display device and an electrical power source.

In accordance with a preferred embodiment of the present invention, the interconnection pattern includes a first conductive pattern, an insulative pattern and a second conductive pattern or jumper pattern. Construction of the circuit in this manner enables production of a circuit pattern having crossover portions in which two conductors are electrically connected and electrically insulated from a crossing conductor. Construction of the circuit in this manner permits implementation of more complicated circuits than would otherwise be obtainable.

In accordance with a preferred embodiment of the present invention, connection of the major electrical components to the circuit pattern is achieved by aligning the component with a depression placed in the bottom case of the apparatus so that the leads of the component are substantially aligned with connection portions of the interconnection pattern printed on the bottom case. The depression in the back case is constructed in order to provide a small gap between the leads of the component and the connection portion of the interconnection pattern printed on the bottom case. As an alternative, such a small gap may be formed using a flat interior surface and bent leads of the component. This gap is filled by placing small portions of conductive adhesive on the individual conductors of the connection portion. Upon placement of the component, the conductive adhesive contacts and adheres to both the individual conductor on the connection portion and the individual lead on the component, thereby providing an electrical connection between the connection portion and the component lead while providing some mechanical support.

In accordance with a preferred embodiment of the present invention, input to the apparatus is achieved via a keyboard comprising a plurality of manually actuable momentary contact key switches. The interconnection pattern printed on the bottom case includes key switch areas, each having a pair of conductors disposed in proximity in an interleaved comb pattern. Individual keys include a shorting means for providing electrical connection between the corresponding pair of conductors of a key switch area, and a biasing means for normally preventing such contact. In the preferred embodiment, each of these keys is constructed as a part of an elastomer keyboard sheet. Each of these keys has a portion which extends vertically from the shorting bar and is adapted for protrusion through a corresponding opening in the top case of the apparatus.

BRIEF DESCRIPTION OF THE DRAWINGS

These and other objects and embodiments of the present invention will be better understood from the following description of the invention taken in conjunction with the drawings in which.

DETAILED DESCRIPTION OF THE PREFERRED EMBODIMENT

Figure 1:
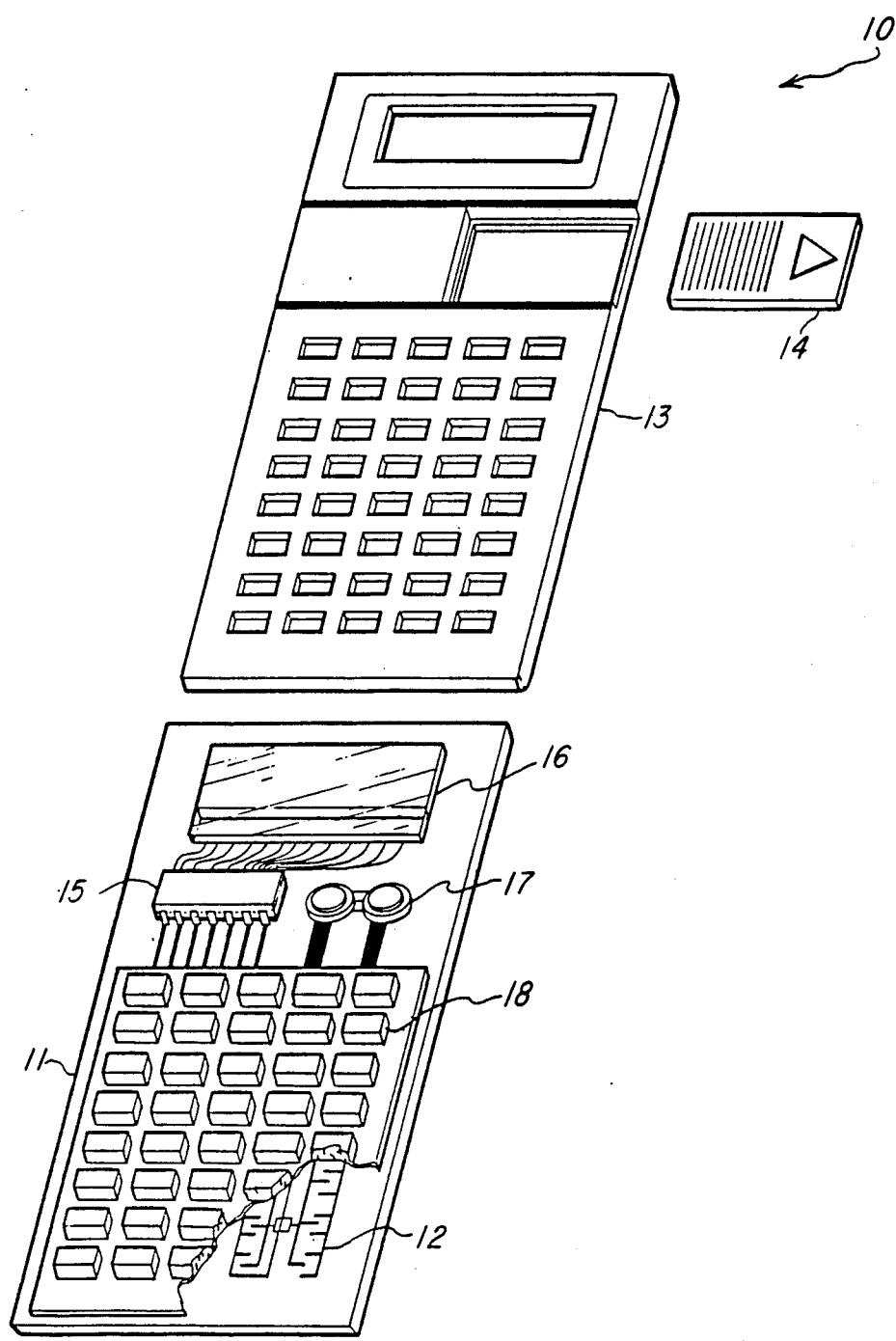
FIG. 1 is an exploded view of the major components of one embodiment of the electronic apparatus of the present invention.

FIG. 1 is an exploded view of the major components of an electronic apparatus constructed in accordance with the teachings of the present invention. The electronic apparatus 10 includes bottom case 11, having a conductive interconnection pattern 12 imprinted thereon, a top case 13 and a battery door 14.

Major electrical components of the electronic apparatus of the present invention are attached to bottom case 11. These electrical components include integrated circuit 15, display device 16 and a power source comprising a pair of batteries 17. These major components are interconnected in the proper manner via the interconnection pattern 12 printed on the bottom case 11.

The last major component of the electronic apparatus in accordance with the present invention is keyboard 18. Keyboard 18 comprises a keyboard sheet having a plurality of keys. These keys are disposed in substantial alignment with key switch portions of interconnection pattern 12 (further disclosed below) and also in registration with key holes disposed within top case 13.

In accordance with the teachings of the present invention, construction of the electronic apparatus 10 is achieved via a few simple steps. Bottom case 11 is formed including the conductive interconnection pattern 12. The major components, including an integrated circuit, a display device and batteries, are attached to the bottom case. Keyboard sheet 18 is sandwiched between the proper key switch areas within conductive interconnection pattern 12 and the key holes of top case 13 as bottom case 11 and top case 13 are joined together. Battery door 14 is inserted within top case 13 thereby properly aligning and connecting batteries 17.

Figure 2:
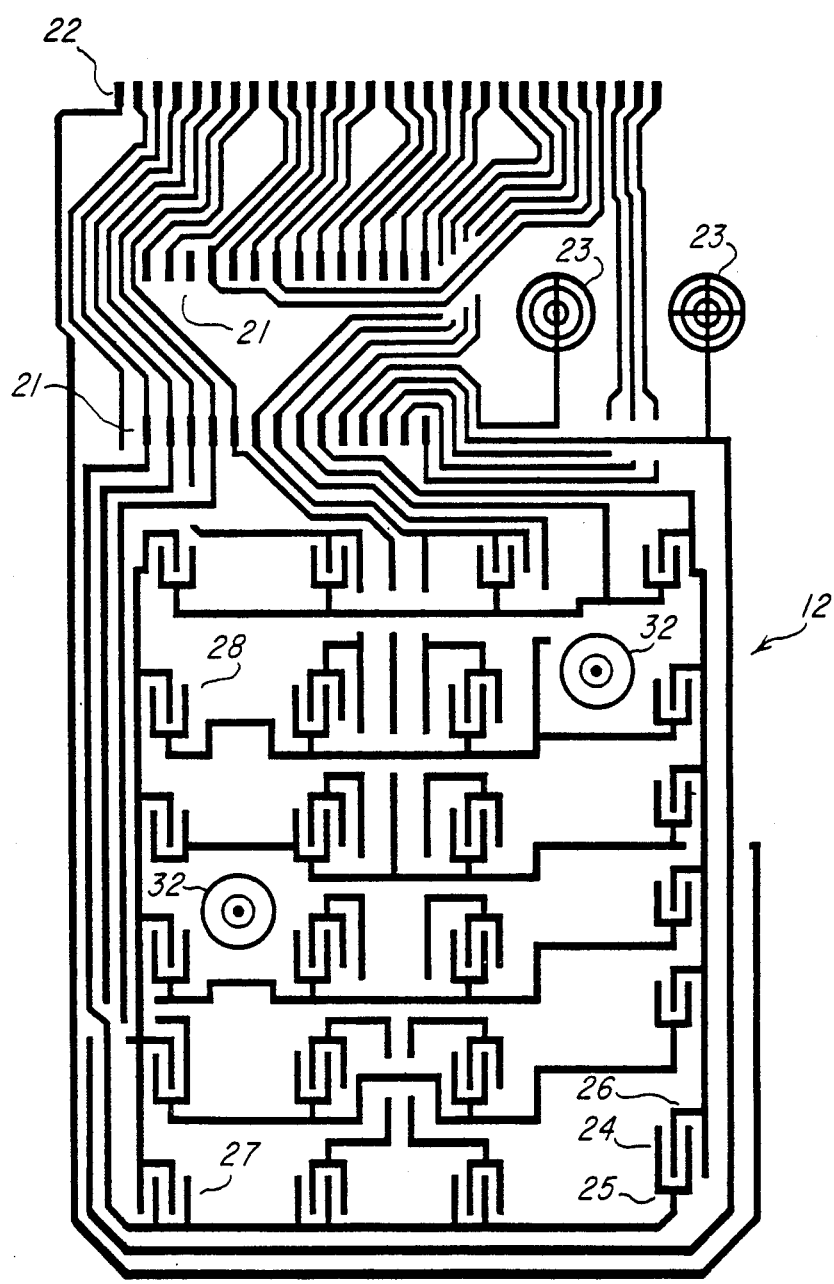
FIG. 2 illustrates a preferred embodiment of the first conductive pattern of the present invention.

FIG. 2 illustrates a preferred embodiment of a first conductive pattern. In accordance with a preferred embodiment of the present invention, the interconnection pattern 12 imprinted on bottom case 11 includes a plurality of crossover portions. In this embodiment bottom case 11 must be constructed of nonconducting material. Each of these crossover portions requires one conductor to cross without electrically joining another conductor. In order to achieve such a crossover, it is necessary to provide two conductive patterns and one insulative pattern within the interconnection pattern 12. FIG. 2 illustrates the first conductive pattern in such a system.

FIG. 2 illustrates the first conductive pattern of interconnection pattern 12. This first conductive pattern includes substantially all of the primary interconnections with the exception of a number of jumpers in crossover positions within the interconnection pattern 12. Interconnection pattern 12 includes sets of connection conductors 21, 22 and 23 which are especially adapted for connection to major components of the electronic apparatus. Connection conductors 21, which are illustrated as including 28 conductors disposed in two rows of 14, are especially adapted for connection to an integrated circuit semiconductor device. Connection conductors 21 are disposed in a position for registration with the external leads of a 28 pin dual in line package integrated circuit. FIG. 2 also illustrates connection conductors 22, which are especially adapted for connection to the display device. For example, the display device may comprise an eight digit liquid crystal display having seven segments for each digit as well as a decimal point. In addition a memory input indicator and a negative sign indicator may also be provided, making a total of 66 display segments. If these are accessed via a one third duty cycle drive method using 3 common lines and 26 select lines then a total of 29 connections is required. Connection conductors 22 illustrated in FIG. 2 include 29 conductors disposed along one edge of the position for the display device. Lastly, interconnection pattern 12 includes connection conductors 23 which are specifically adapted for connection to the terminals of a pair of batteries employed as the power source of the apparatus.

Interconnection 12 illustrated in FIG. 2 includes a plurality of key switch positions 24. These key switch positions 24 are disposed in a matrix having six rows and four columns. Each key switch position 24 has a pair of conductors 25 and 26. The conductor 25 of each key switch position 24 is connected to a row conductor. The conductor 26 of each key switch position 24 is connected to a column conductor. These conductors 25 and 26 are disposed in an interleaved comb pattern whose purpose will be further described below.

In addition to the ordinary key switch positions 24 illustrated in FIG. 2, FIG. 2 further illustrates two special key switch positions 27 and 28. In accordance with the teachings of U.S. Pat. No. 4,115,705 "Electronic Calculator with Push-Button On-Off System" issued to David J. McElroy Sept. 19, 1978, the preferred embodiment of the electronic apparatus of the present invention includes momentary contact on and off switches. In accordance with the teachings of the above cited patent, key switch portions 27 and 28 (together with the other key switches 24 in the left most column) have one of the conductors connected to one terminal of the power supply, that is one of the two connection conductors 23 provided for connection to the pair of batteries. The other conductor of key switch portions 27 and 28 is connected to the column conductors in the manner of the other key switch positions 24. In accordance with the teachings of the above cited patent, the integrated circuit of the present apparatus is provided with a latch circuit having two stable conditions. Actuation of the key corresponding to key switch position 27 insures that the latch places the integrated circuit in the on condition. Actuation of the key corresponding to key switch position 28 insures that the latch places the integrated circuit in the off state.

FIG. 2 further illustrates concentric alignment patterns 32. Concentric alignment patterns 32 are employed in conjunction with similar concentric alignment patterns illustrated in FIGS. 3 and 4 as alignment gauges for the completed pattern. When the three layer interconnection pattern is complete, concentric alignment patterns 32, 33 (illustrated in FIG. 3) and 34 (illustrated in FIG. 4) form a set of concentric circles, if the three printed layers were properly aligned. Because of the concentric circle pattern, it is very easy to distinguish misaligned patterns and reject a part having such a misaligned pattern.

Figure 3:
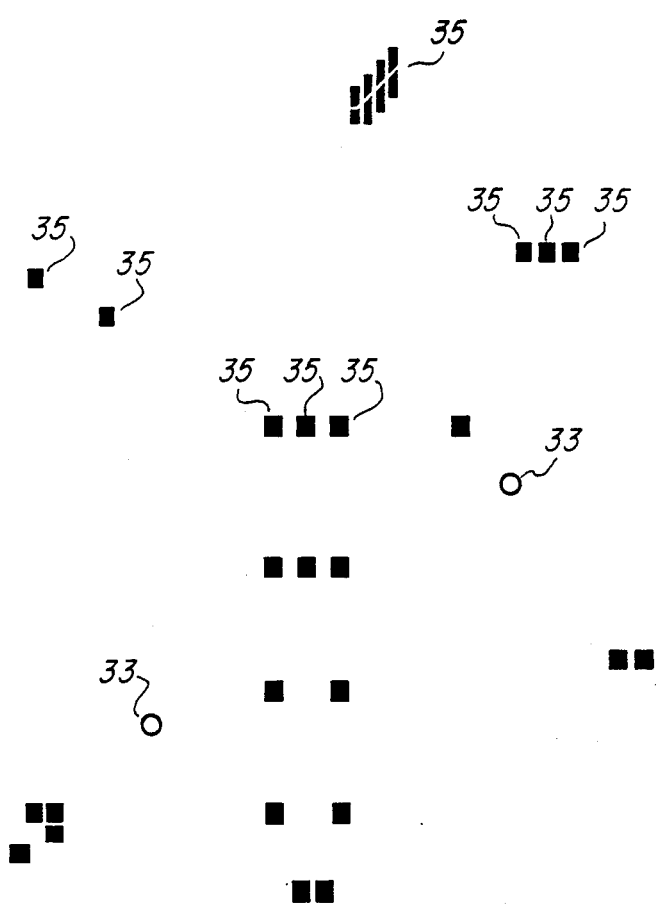
FIG. 3 illustrates the insulative pattern corresponding to the first conductive pattern illustrated in FIG. 1.

FIG. 3 illustrates the insulative pattern; The insulative pattern includes a plurality of insulators 35 which are disposed at predetermined crossover positions on the bottom case 11. Each of the insulators 35 is disposed to overlie and cover a small portion of the first conductive pattern illustrated in FIG. 2. The insulative pattern also includes concentric alignment patterns 33.

Figure 4:
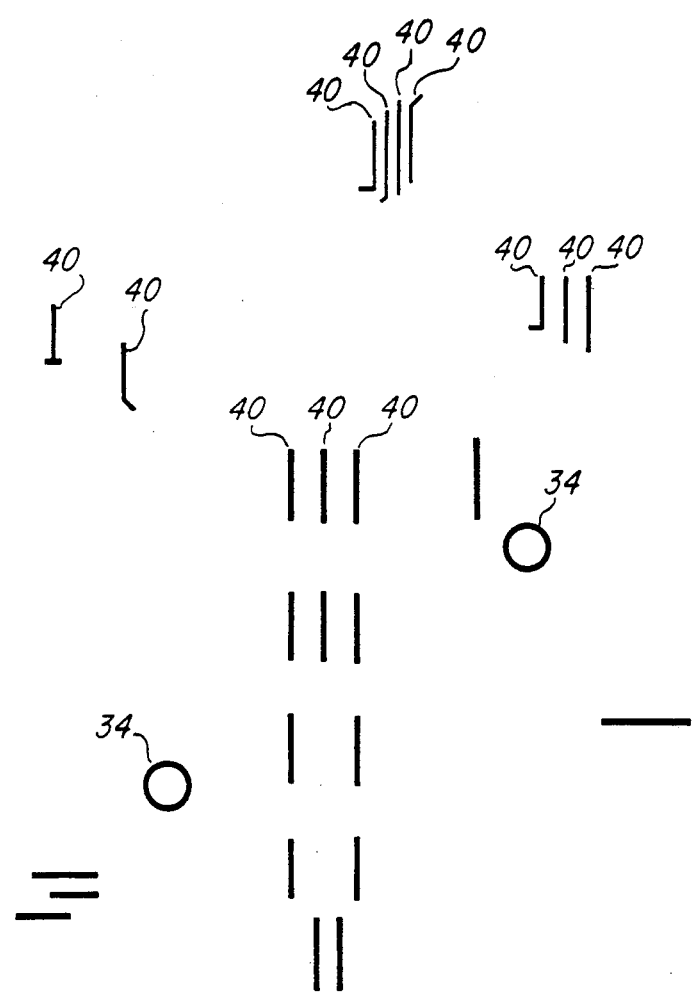
FIG. 4 illustrates the second conductive pattern or jumper pattern used in conjunction with the embodiments illustrated in FIGS. 2 and 3.

FIG. 4 illustrates the second conductive pattern or jumper pattern. The second conductive pattern includes a plurality of conductors 40. Each of these conductors 40 is disposed in a position to overlie the previously transferred insulators 35 illustrated in FIG. 3. In addition, each of these conductors 40 extends beyond the ends of its corresponding insulator 35 to contact selected portions of the first conductive pattern illustrated in FIG. 2. Using this technique the conductor 40 electrically connects to separate conductors of the first conductive pattern illustrated in FIG. 2 while being insulated from a crossing conductor by virtue of the insulator 35. Thus this technique enables the construction of an interconnection pattern 12 which is more complex than would be possible if such crossovers were not permitted. The second conductive pattern also includes concentric alignment pattern 34.

The three patterns illustrated in FIGS. 2, 3 and 4 are preferably formed on the bottom case 11 via a pad transfer printing process. Initially the image to be transferred is etched into a steel cliche plate. Thus for example the image of the first conductive pattern illustrated in FIG. 2 would be etched into a first cliche plate. This cliche plate is preferably made of milled and hardened steel to permit long life. The depth of this etch is directly proportional to the amount of ink to be transferred from the cliche plate to the work piece, which is bottom case 11 in the preferred embodiment.

Once the cliche plates have been formed for the desired printed images, these cliche plates are placed upon an automatic printing apparatus which carries out the printing process. An ink reservoir is placed along one end of the cliche plate in a cliche holder assembly. This ink reservoir stores the particular ink to be employed in forming the image of that particular plate. Firstly, a spatula blade is withdrawn from the ink reservoir and carries a thick layer of ink over the cliche plate. As the arm carrying the spatula is returned, a thinner doctor blade wipes the cliche plate clean of ink except for the ink now stored within the etched portion of the plate. This etched portion of the plate has the image desired to be transferred to the work piece.

Next a soft silicon rubber transfer pad is pressed down and compressed over the cliche plate in the vicinity of the image etch. As the pad is withdrawn, substantially all of the ink previously stored in the etched image of the cliche plate now adheres to the surface of the pad. Lastly, the pad is moved to the position of the work piece and is pressed down and compresses over the work piece. When the pad is withdrawn from the work piece, substantially all of the ink previously held by the pad is now transferred to the surface of the work piece.

The ability to control the transfer of ink from the cliche plate to the pad to the work piece depends upon the relative adhesion of the ink to these surfaces. A steel cliche plate is ordinarily employed to insure that substantially all of the ink is removed from the etched image during the initial step. The particular composition of the silicon rubber pad is then selected in order to insure substantial removal of the ink from the etched image and also substantial transfer of this ink to the work piece.

In a typical practical machine which performs this printing process, a single arm is employed for both the spatula and wiper blade and the transfer pad. Thus as the pad is withdrawn from the cliche plate and transferred to the site of the work piece, this arm also causes the spatula to transfer the ink to the cliche plate for the next printing. Upon removal of the pad from the work piece and withdrawal to the image on the cliche plate, the doctor blade also passes across the surface of the cliche plate to clean all of the ink except that stored within the etched portion. Thus the cliche plate is then ready for transfer of the next image. In addition, a practical printing machine of the type described will most often also include some form of automated work piece movement, so that a new work piece is presented at the printing site each time the pad is prepared for transfer of ink.

As will be clearly understood from a study of the above description in relation to FIGS. 2, 3 and 4, each bottom case 11 must undergo three separate printing processes as described above. The first conductive pattern illustrated in FIG. 2 is transferred to the bottom case 11 followed by transfer of the insulative pattern illustrated in FIG. 3 and lastly the second conductive pattern illustrated in FIG. 4 is transferred. The transfer printing process described above can be readily adapted to such a three step transfer printing process. This is easily achieved by providing three separate cliche plates with separate etches for each of the three patterns or one single cliche plate with three separate etched areas each corresponding to one of the patterns. Each separate cliche plate or etched area would employ its own ink reservoir having the proper ink for that particular pattern. The apparatus would be provided with three separate arms each having a spatula and doctor blade for properly applying the ink to the corresponding etched pattern and each having its own silicon rubber transfer pad for transfer of the ink of that particular pattern.

In a preferred embodiment, three separate work pieces would be employed simultaneously, one for each of the three separate patterns. A conductive ink would be transferred on to a first work piece according to the pattern illustrated in FIG. 2, an insulative ink would be transferred on to a separate work piece in accordance with the pattern illustrated in FIG. 3 and conductive ink would be transferred on to a third work piece in accordance with the pattern illustrated in FIG. 4.

Upon withdrawal of the printing arms, the work pieces would be transferred one station. This would place a new work piece at the station for receiving the first conductive pattern. In addition the work piece previously receiving the first conductive pattern would be placed in the center station to receive the insulative pattern. Lastly, the work piece which had just received the insulative pattern would be placed in the third work station in order to receive the second conductive pattern. The work piece which had previously received the second conductive pattern would be transferred out of the printing area as this work piece is complete.

As noted above, the preferred embodiment for forming the interconnection pattern involves a pad transfer printing process. This process is advantageous in that it can readily accommodate surface irregularities in the work piece. For example, as noted below, the integrated circuit may be mounted in a depression 29 in bottom case 11 and the above described pad transfer printing process would enable easy formation of conductors between connection conductors 21 as shown in FIG. 2 despite the presence of depression 29. However, if accommodation to surface irregularities is not required the patterns illustrated in FIGS. 2, 3 and 4 may be produced by other known methods such as silk-screening.

The inks employed in this interconnection pattern manufacture technique are of two types, solvent inks and ultraviolet light cured inks. In the case of solvent inks, a preferred conductive ink is DuPont 4198. Dupont 4198 uses silver as its primary conductor and comprises approximately 70% silver suspended in butyl cellusolve acetate. After transfer of the ink to the work piece, the ink would cure by evaporation leaving the silver conductor behind. This solvent conductive ink could be employed for both the first conductive pattern and the second conductive pattern. A preferable insulative ink is solder mask type LA from Weiderhold. This insulative ink is also of the solvent cure type.

Solvent inks of the type described above are constantly deteriorating due to premature curing prior to application to the work piece. The solvent in subsequent layers of solvent ink causes previously formed layers, even if fully cured, to deteriorate. Thus solvent inks are less desirable from a reliability standpoint than ultraviolet light cured inks. Ultraviolet light cured inks are formed of monomer molecules. Upon exposure to ultraviolet light of a proper wave length, intensity and duration, these monomers are formed into polymers which substantially fix the ink pattern on to the work piece. A preferable ultraviolet light conductor ink is Methode 6065E. Two preferable insulator inks are Unimask 2000 and SPR-WE-7, both available from W. R. Grace. A preferable manufacturing method when ultraviolet inks are employed would include an ultraviolet light source to cure the transferred patterns during the period while the work pieces are advanced to the next work station.

After the three layer interconnection pattern is formed as described above, it is preferable that the patterns be tested to determine if they are properly formed. A visual test employing concentric interconnection patterns 32, 33 and 34 has been detailed above. It is preferable that an electrical test also be performed. This may be achieved as an additional step following the three step printing process. An electrical probe is lowered to the completed bottom case having multiple prove tips contacting the conductive pattern at predetermined locations. It is possible using such an apparatus to rapidly test each crossover for proper electrical conduction through each of the jumpers illustrated in FIG. 4 and for proper insulation by each of the insulators illustrated in FIG. 3. This automated electrical test preferably includes some technique for separating out the rejected bottom case automatically so that only properly constructed bottom cases are employed in the final assembly process.

Figure 5:
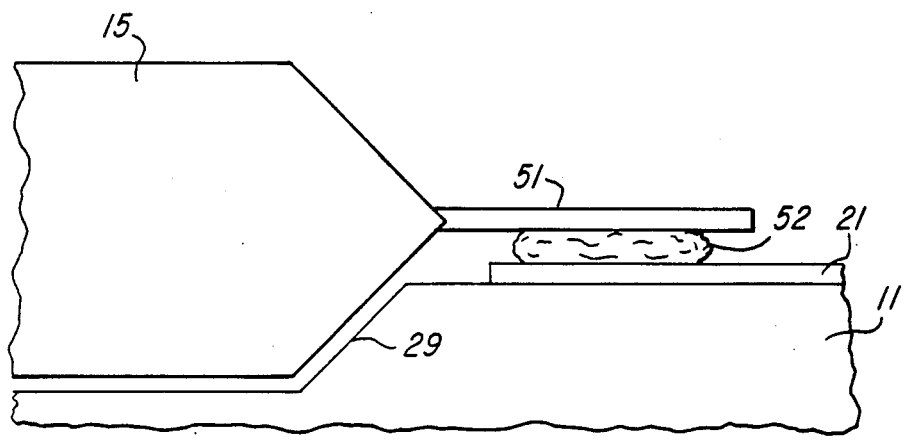
FIG. 5 illustrates a preferred embodiment of the manner in which an integrated circuit is coupled to the interconnection pattern in accordance with the teachings of the present invention.

FIG. 5 illustrates a preferred embodiment for attachment of the integrated circuit 15 to the bottom case 11. Integrated circuit 15 forms the major electrical component of the electronic apparatus of the present invention. As illustrated in FIG. 2, the interconnection pattern printed on bottom case 11 includes a first set of connection conductors 21 for attachment to the leads of the integrated circuit 15. This connection is shown in cross section in FIG. 5.

FIG. 5 illustrates the details of the attachment of integrated circuit 15 to the first set of connector conductors 21 of the interconnection pattern. FIG. 5 illustrates depression 29 within bottom case 11. Depression 29 is formed to substantially conform to the shape of integrated circuit 15. FIG. 5 illustrates a cross sectional view of one side of a particular integrated circuit in a dual in line plastic package. Integrated circuit 15 includes leads 51 which protrude from the ends of the plastic package. Most dual in line integrated circuits are sold with the leads bent for easier insertion into a printed circuit board, however FIG. 5 illustrates that lead 51 of integrated circuit 15 is straight and unbent. By careful matching of the known dimensions of the plastic case of integrated circuit 15 with the dimensions of depression 29 a small gap of known dimensions between lead 51 of intergrated circuit 15 and conductor 21 printed upon bottom case 11 is formed. This small gap is filled by a conductive adhesive 52, which is illustrated in FIG. 5 as adhering to both lead 51 and conductor 21. In addition, in a preferred embodiment, the plastic case of integrated circuit 15 is attached to the bottom of depression 29 by some other type of adhesive which serves as the major mechanical connection between integrated circuit 15 and bottom case 11. Many commercially available adhesives are suitable for this purpose and will not be described further.

Figure 6:
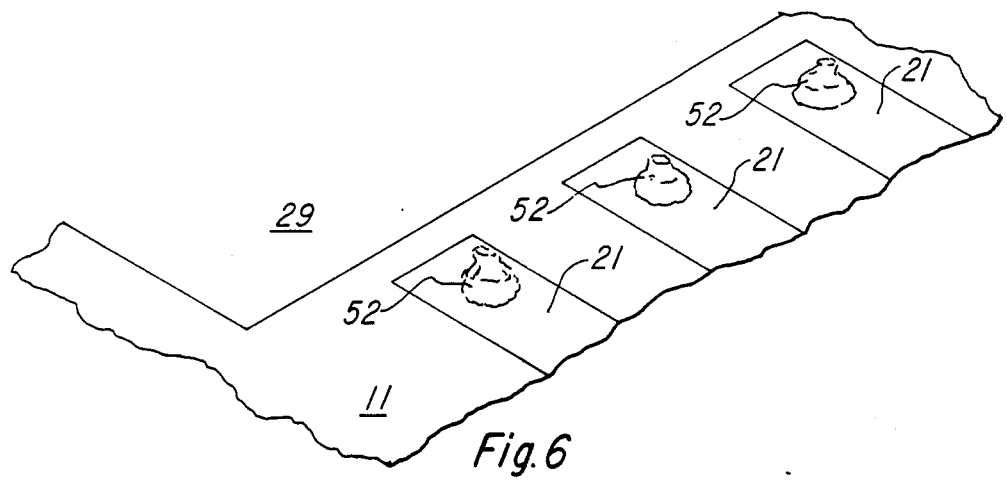
FIG. 6 illustrates a preferred embodiment of the placement of the conductive adhesive on the connector portion of the interconnection pattern.

FIG. 6 illustrates that manner in which the conductive adhesive 52 is placed between the conductors of the integrated circuit and the interconnection pattern. FIG. 6 illustrates a portion of bottom case 11 near depression 29, which is especially adapted for holding the integrated circuit 15. Along the edge of depression 29 are a plurality of conductors 21. Each of these conductors 21 forms a part of the interconnection pattern printed on bottom case 11. A small portion of conductive adhesive 52 is shown as placed at a predetermined spot on each of the conductors 21 near the edge of depression 29. These small portions of conductive adhesive 52 may be properly placed by a silk screen process or a mask printing technique. By properly placing a carefully controlled amount of conductive adhesive on conductors 21, it is possible to substantially fill the predetermined gap between connectors 21 and lead 51 while minimizing the possibility of shorts between adjacent connectors 21.

The above described embodiment for connecting integrated circuit 15 to the interconnection pattern 12 substantially reduces alignment problems. By proper correspondence of depression 29 to the known dimensions of the plastic case of integrated circuit 15 it is possible to constrain the possible positions of leads 51 so that they invariably correspond to the proper conductors 21. Thus integrated circuit 15 could be hand placed within depression 29 of bottom case 11 or could be placed via automated machinery without requiring extremely close tolerances in the placement of the integrated circuit.

Figure 7:
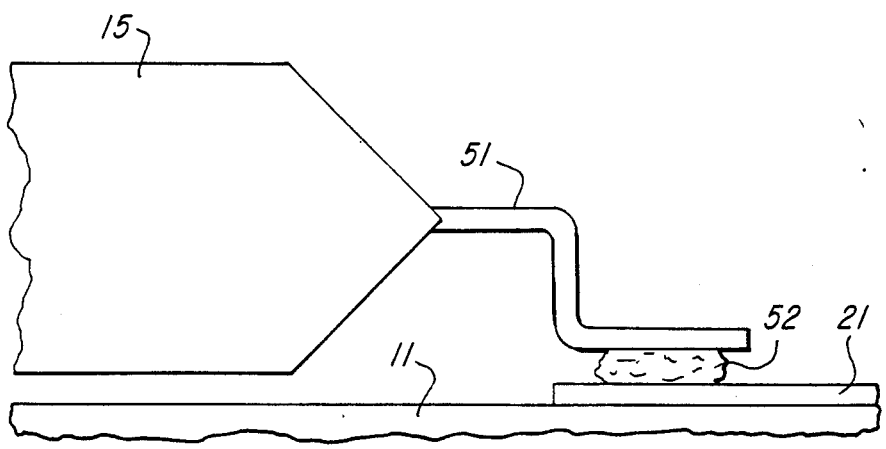
FIG. 7 illustrates an alternative embodiment for connection of an integrated circuit to the interconnection pattern.

FIG. 7 illustrates a cross sectional view of an alternative embodiment for attachment of integrated circuit 15 to the conductors 21. In accordance with the more normal practice, FIG. 7 illustrates integrated circuit 15 having a bent lead 51. FIG. 7 illustrates that integrated circuit 15 is placed upon bottom case 11 in a position so that leads 51 are substantially aligned with the corresponding connection portion 21. As illustrated in FIG. 5, FIG. 7 shows conductive adhesive 52 placed between lead 51 and conductor 21. As described above in conjunction with FIG. 5, it is preferable to include some form of mechanical adhesive between the plastic case of integrated circuit 15 and back case 11 to provide the major mechanical hold between these components. As an alternative, the major mechanical hold upon the integrated circuit may be achieved via a pressure fit between bottom case 11 and top case 13, perhaps employing a post such as post 94 illustrated in FIG. 16. Therefore, the major task performed by conductive adhesive 52 is electrical connection between the integrated circuit and the interconnection pattern.

Figure 8:
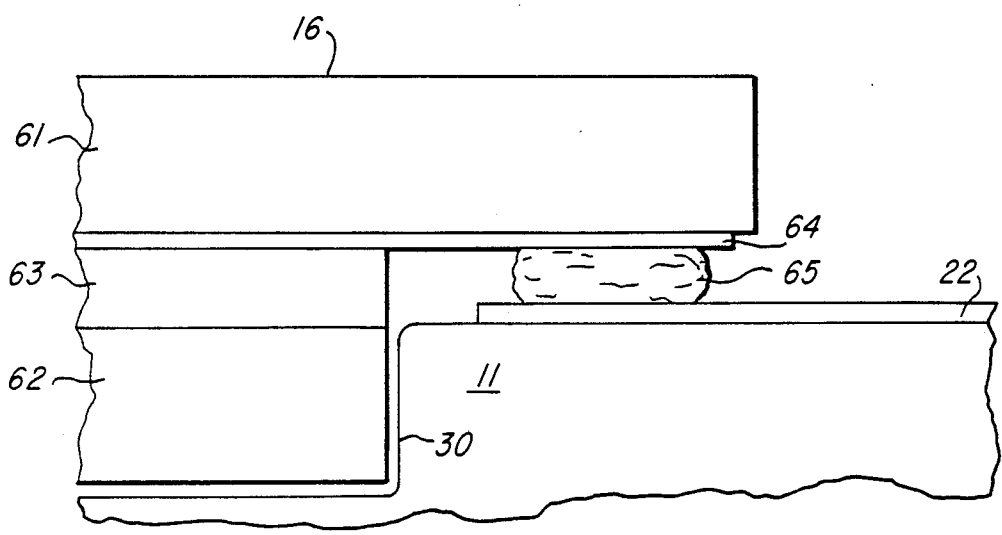
FIG. 8 illustrates the preferred embodiment for connection of a liquid crystal display device to the interconnection pattern.

FIG. 8 illustrates a cross sectional view of a preferred embodiment for attachment of a display device to interconnection pattern 12. Display device 16 is preferably a liquid crystal display device. Display device 16 includes front glass plate 61 and back glass plate 62. Sandwiched between these two glass plates is a cavity 63 which includes the major components of the liquid crystal display including the electrodes and the liquid crystal chambers. In the cross section illustrated in FIG. 8, electrode 64 is shown as adhering to one surface of glass plate 61 and emerging from chamber 63. It should also be noted that the upper glass plate 61 extends beyond the edge of the lower glass plate 62.

Bottom case 11 includes depression 30 constructed in order to accommodate the display device 16. Depression 30 is constructed of a depth compared to the known dimensions of display device 16 so that, when display device 16 is placed within depression 30, there is a predetermined gap between electrode 64 and conductor 22 deposited on bottom case 11. As described above in conjunction with the attachment of integrated circuit 15 to bottom case 11, a conductive adhesive 65 is disposed between the electrode 64 of the display device 16 and the conductor 22 disposed on bottom case 11. The conductive adhesive 65 may be initially placed on conductor 22 in the same manner as illustrated in FIG. 6 and described above. In addition, in the manner described above in conjunction with attachment of integrated circuit 15, it is preferable that another adhesive is employed to attach back plate 62 of display device 16 to the bottom of depression 30. By this manner, the major mechanical stress is taken by this mechanical adhesive and the major task fulfilled by conductive adhesive 65 is electrical connection of display device 16 to the interconnection pattern 12. As noted above in relation to mechanical support of the integrated circuit, as an alternative, major mechanical support of the display device may be provided by a press fit between bottom case 11 and top case 13.

In an alternative embodiment, the conductive adhesive employed for electrical connection of the integrated circuit or the display device may be replaced by a conductive elastomeric interface. A conductive elastomeric interface is made of alternating conductive and nonconductive layers of a flexible, elastic material. The integrated circuit or display device may be coupled to the corresponding connection conductors using such a conductive elastomeric interface having vertical layers. These vertical layers have a size which is less than the minimum spacing between the connection conductors or the leads of the electrical component. Preferably the layers are sized so that a plurality of the conductive layers can be fitted into the width of one connection conductor or component lead.

Figure 9:
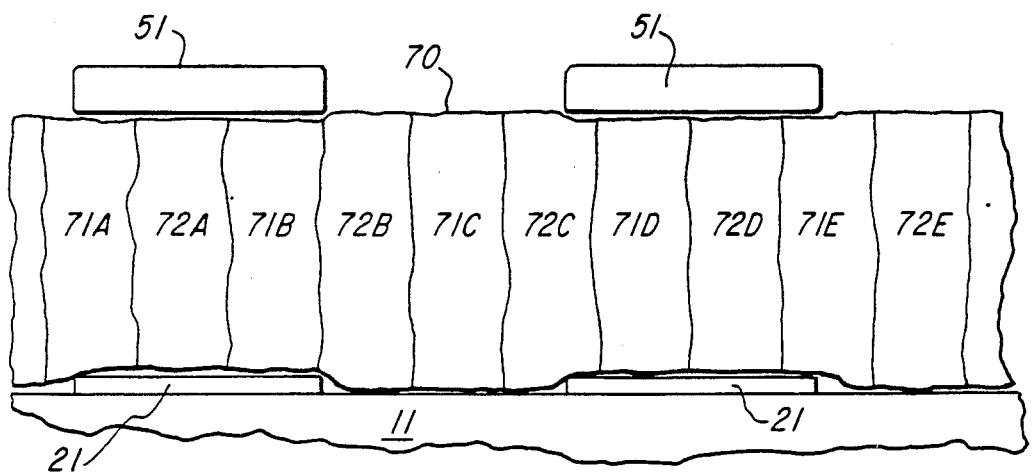
FIG. 9 illustrates an alternative embodiment of the connection of an integrated circuit to the interconnection pattern employing a conductive elastomeric interface.

FIG. 9 illustrates the positioning of such a conductive elastomeric interface 70 between leads 51 and connection conductors 21 mounted on bottom case 11. Conductive elastomeric interface 70 includes conductive layers 71A, 71B, 71C, 71D and 71E sandwiched between insulative layers 72A, 72B, 72C, 72D and 72E. The leftmost lead 51 is electrically connected to the leftmost connection conductor 21 via conductive layers 71A and 71B. Similarly the rightmost lead 51 and the rightmost connection conductor 21 are electrically connected via conductive layers 71D and 71E. These connections are insulated from one another by insulative layers 72B and 72C. Because the distance between adjacent leads 51 and connection conductors 21 is greater than the width of a conductive layer, there is no possibility of shorting adjacent connections. The layer width has been selected relative to the width of leads 51 and connection conductors 21 so that at least one and often two conductive layers will make the electrical connection. So long as leads 51 and connection conductors 21 are substantially aligned, proper connections are formed no matter what the alignment of conductive elastomeric interface 70. Conductive elastomeric interface 70 is held in place by mechanical force provided by the mechanical adhesive or the pressure fit used to secure the electrical component.

Figure 10:
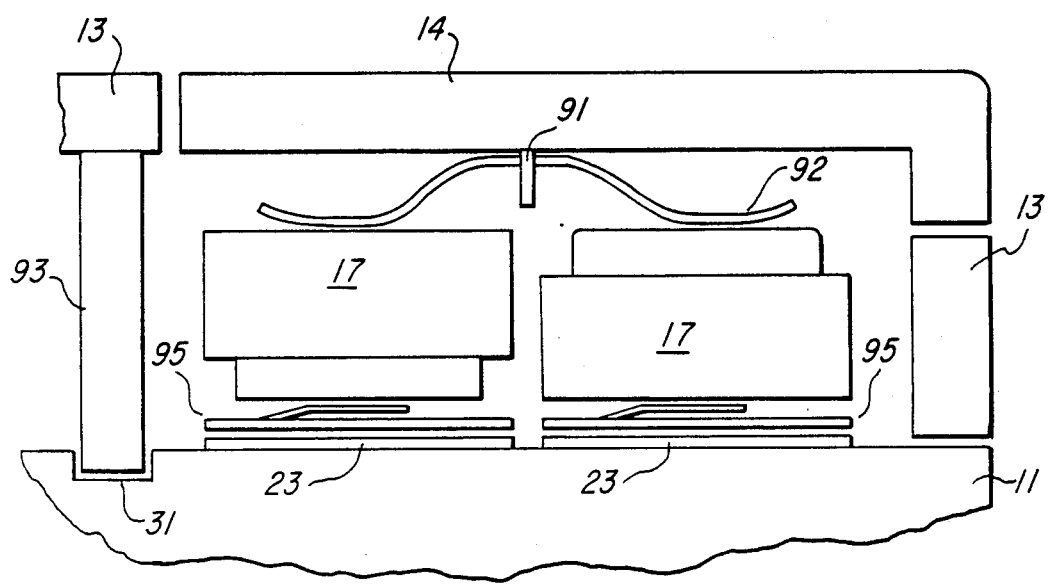
FIG. 10 illustrates a preferred embodiment of the manner in which a pair of batteries are coupled to the interconnection pattern.

FIG. 10 illustrates a cross sectional view of the manner of attachment of batteries 17 to the apparatus. FIG. 10 illustrates bottom case 11, top case 13, battery door 14 and a pair of battery cells 17. Each of the battery cells 17 is disposed on and placed in electrical contact with one of the conductors 23 (see FIG. 2). Conductors 23 serve as the means for connecting the power source represented by battery 17 to the circuit of the electronic apparatus.

Figure 11:
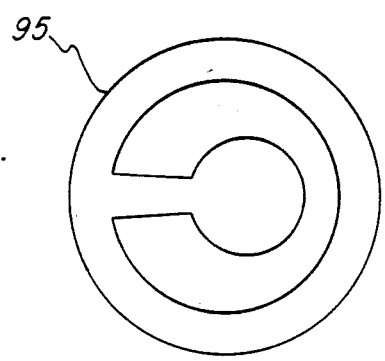
FIG. 11 illustrates the detail of a spring employed for connection of batteries to the interconnection pattern.

Battery door 14 preferably includes a post 91 disposed on the interior surface thereof. A steel spring 92 is preferably disposed on the interior surface of battery door 14 in contact with post 91. Post 91 serves as a tie point for securing spring 92 to the interior surface of battery door 14. As illustrated in FIG. 10, spring 92 preferably contacts one end of each of the batteries 17. Spring 92 thus performs two functions. Firstly, it provides electrical connection between one terminal of each of the batteries 17, thereby connecting these batteries in series across the two conductors 23. In addition, steel spring 92 is preferably constructed in order to provide some mechanical force pressing batteries 17 into the conductors 23. This mechanical force is advantageous in assuring proper electrical contact of the batteries 17 in series across conductors 23. Additionally, steel springs 95 may be disposed between each battery 17 and its corresponding connection conductor 23. Steel springs 95 supply additional mechanical force for retaining batteries 17, and further supply some mechanical compliance enabling batteries 17 to move during mechanical shock and recover with proper electrical connection. Steel springs 95 are preferably formed of stamped sheet metal as illustrated in FIG. 11 and are connected to connection conductors 23 via conductive adhesive to remain in place during battery removal. Alternatively, if additional shock absorption capacity is not required, batteries 17 may be directly connected to connection conductors via conductive adhesive.

In the preferred embodiment battery door 14 has lips which slide in grooves within top case 13 in order to secure battery door 14 in top case 13. Springs 92 and 95 preferably are compressed during this operation, thereby generating the above described force and also tending to hold battery door 14 in place.

FIG. 10 illustrates additional features which tend to secure batteries 17 from lateral motion. Firstly, the right most battery 17 is prevented from extreme motion to the right by the end portion of top case 13 which forms the side of the electronic apparatus. In addition, the left most battery 17 is restrained from movement to the left by post 93 formed in top case 13. Post 93 is illustrated as extending from top case 13 and resting within depression 31 within bottom case 11. Bottom case 11 has a plurality of depressions 31 which are disposed in position corresponding to post 93 of top case 13. This combination of post 93 and depression 31 enables substantial mechanical contact between bottom case 11 and top case 13. This substantial mechanical contact greatly facilitates the mechanical connection of bottom case 11 to top case 13. One or more posts 93 with corresponding depressions 31 may be disposed in positions adjacent to the positions of batteries 17 in order to restrain lateral movement of batteries 17.

Figure 12:
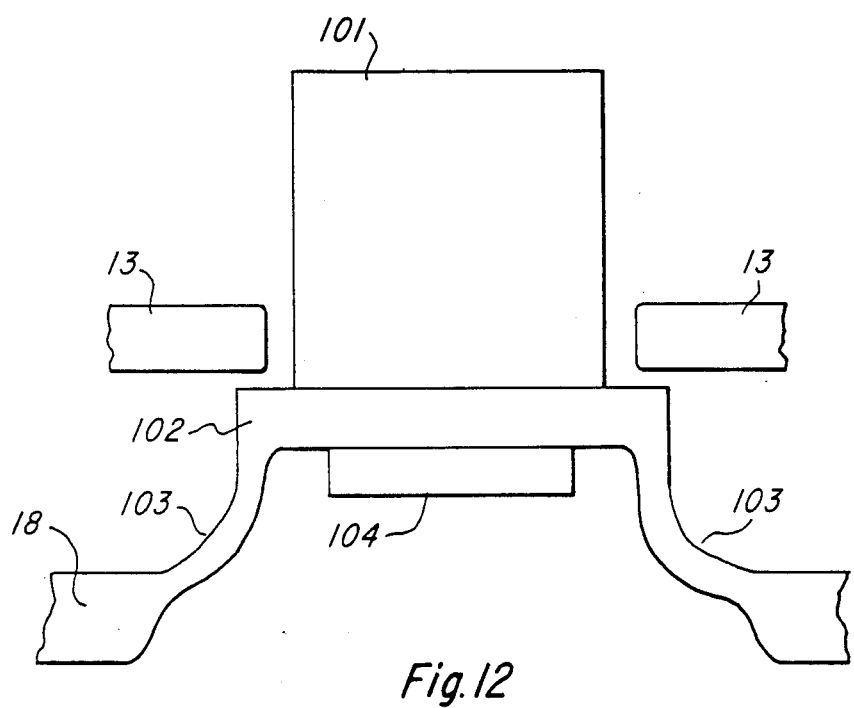
FIG. 12 illustrates a preferred embodiment of a key in the nondepressed or inactuated position.
Figure 13:
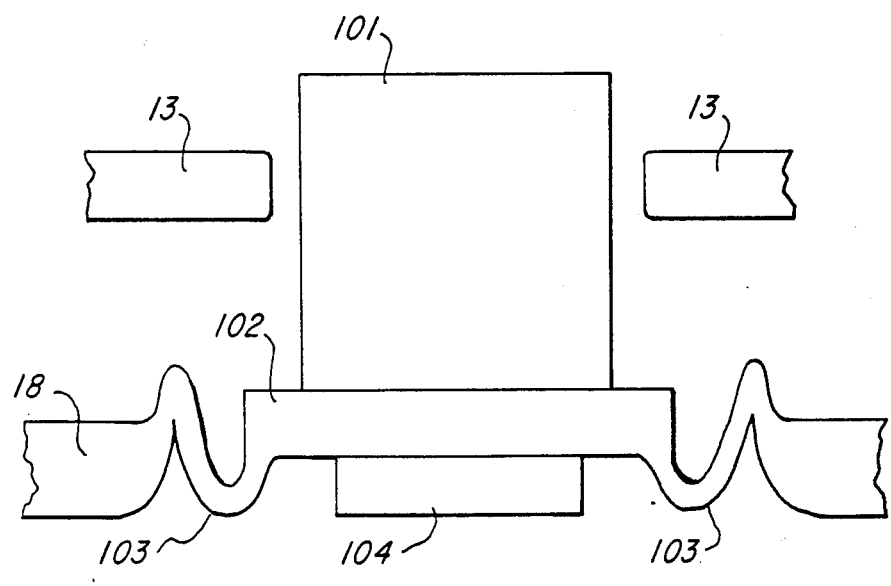
FIG. 13 illustrates the preferred embodiment of a key in the depressed or actuated position.

FIGS. 12 and 13 illustrate the operation of one key of the keyboard sheet 18. FIG. 12 illustrates the key in the nondepressed, inactuated state and FIG. 13 illustrates the key in the depressed, actuated state.

Keyboard sheet 18 includes a plurality of key tops 101 which are disposed within the interior of the electronic apparatus and extend through key apertures within top case 13. Each key top 101 has a corresponding major plate 102 which lies beneath the aperture through top case 13 and substantially restrains additional vertical movement through the aperature. Each key includes a flexible portion 103 around the periphery of major plate 102 for attachment of the particular key to keyboard sheet 18. Flexible portion 103 includes a reduced cross sectional dimension which permits substantial flexure in the vertical direction when pressure is applied to the top of key top 101. At the bottom of major plate 102 is a conductive portion 104 which is constructed of a conductive material and which is disposed in alignment with each of the key switch areas 24, 27 and 28 illustrated in FIG. 2.

The ordinary operation of each key is as follows. The flexible portion 103 urges the major plate 102 upward toward the aperture within top case 13. This causes key top 101 to be fully extended and more importantly prevents conductive portion 104 from contact with the particular key switch position below. Upon application of vertical pressure to key top 101, flexible portion 103 is strained until it undergoes a folding state as illustrated in FIG. 13. Upon achievement of the folding state, key top 101 as well as major plate 102 and conductive portion 104 are forced downward until conductive portion 104 contacts the pair of conductors 25 and 26 of the corresponding key switch position 24, 27 or 28. This contact causes electrical conduction between conductors 25 and 26. Note that conductors 25 and 26 are formed in an interleaved comb pattern in order to assure a greater reliability in switch closure by creating a longer periphery where conductors 25 and 26 are adjacent. This electrical conduction is sensed by integrated circuit 15 as a key switch closure. In accordance with the construction of integrated circuit 15, this key switch closure is interpreted as entry of data or commands.

During this time the flexible portion 103 is under considerable stress and resists this stress with upward pressure upon major plate 102. Release of the vertical pressure of key top 101 causes flexible portion 103 to urge major plate 102 upward towards its rest position. As a result, conductive portion 104 is no longer placed in contact with the pair of conductors 25 and 26, thereby breaking the electrical connection.

The sudden switch between the substantially flat state of flexible portion 103 illustrated in FIG. 12 to the folded or warped state illustrated in FIG. 13, generates a substantial positive feel to the finger employed for depression of key top 101. This keyboard feel enables feedback to the operator that the key switch has been depressed.

Figure 14:
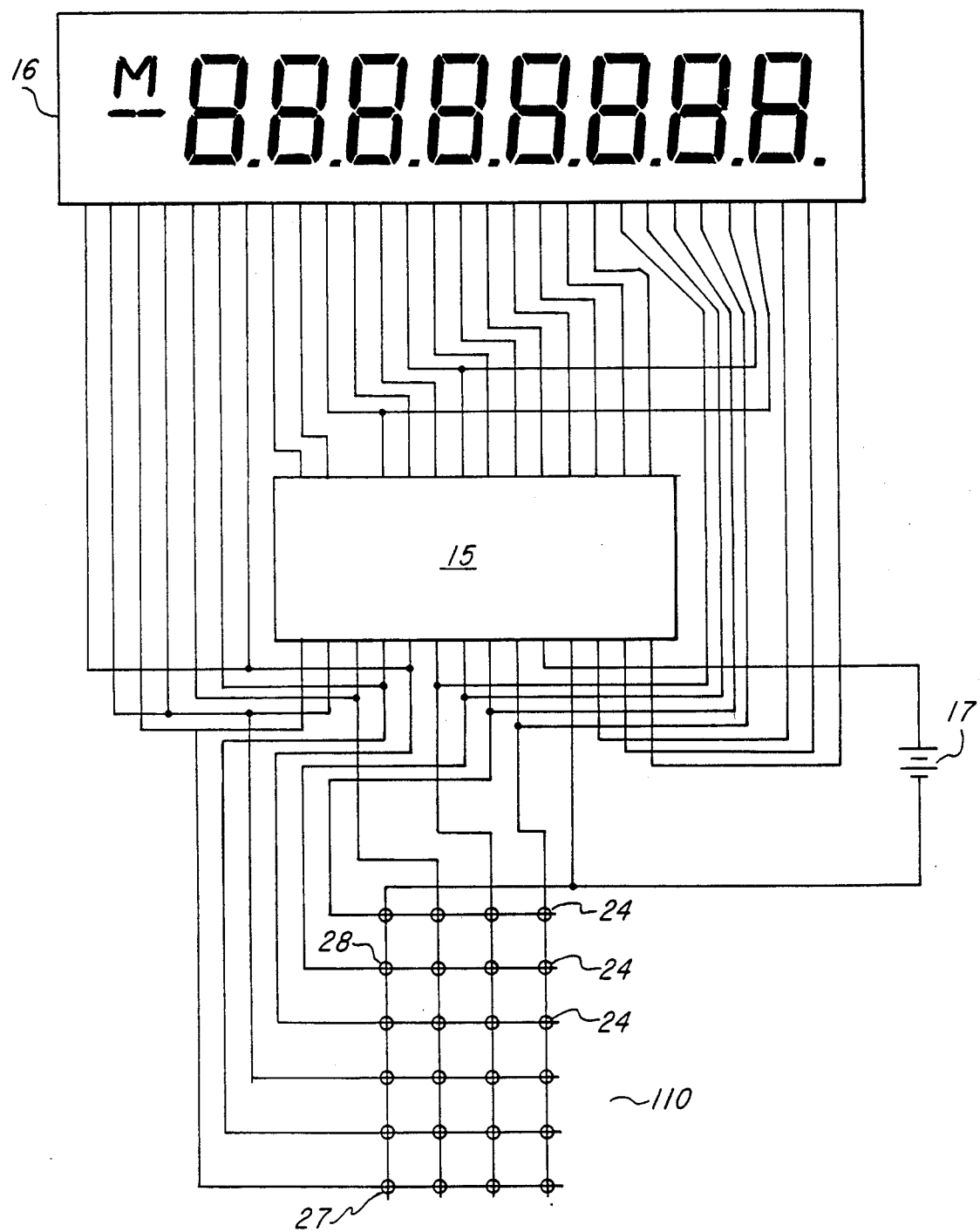
FIG. 14 illustrates an electronic schematic diagram of a preferred embodiment of the apparatus constructed in accordance with the teachings of the present invention.

FIG. 14 illustrates an electrical schematic diagram of a preferred embodiment of the electronic apparatus constructed in accordance with the present invention. Note that the schematic diagram illustrated in FIG. 14 is embodied in the three patterns forming the interconnection pattern illustrated in FIGS. 2, 3 and 4.

FIG. 14 illustrates electronic apparatus 10. Electronic apparatus 10 includes integrated circuit 15, display device 16, power supply 17 and a keyboard 110 including keys 24, 27 and 28. Integrated circuit 15 is illustrated as including 28 pins, one of which is not connected. In accordance with the teachings of U.S. Pat. No. 4,242,657 "Display and Keyboard Scanning for Electronic Calculator or the Like" issued to Gary W. Boone and Michael J. Cochran on Dec. 30, 1980, integrated circuit 15 includes a combined display and keyboard scan. One set of pins from integrated circuit 15 is attached directly to display device 16. Display device 16 is illustrated as including eight seven-segment digits with decimal points with the addition of a memory indicator and a negative sign indicator. FIG. 14 illustrates another set of terminals from integrated circuit 15 which is applied to the column conductors of the keyboard 110. A third set of terminals from integrated circuit 15 is applied in parallel to terminals of display device 16 and to the row conductors of keyboard 110. This circuit permits integrated circuit 15 to generate combined keyboard and display scan signals on the common lines for application to both keyboard 110 and display device 16. Actuation of any key from keyboard 110 is recognized by sensing the voltage on the keyboard column conductors. The lines from integrated circuit 15 which are applied directly to display device 16 provide display information in conjunction with the scan signals for generating the desired visual display. The combined system illustrated in FIG. 14 is constructed in accordance with the teachings of U.S. Pat. No. 4,326,265 "Variable Function Programed Calculator" issued to Gary W. Boone on Apr. 20, 1982.

In some cases it is necessary to depart from the circuit illustrated in FIG. 14 by provision of one or more discrete components external to integrated circuit 15. For example, it may be desirable to substitute a photovoltaic cell power supply for the batteries 17 illustrated in FIG. 14. In such a case it is easy to provide a photovoltaic cell sufficiently large to generate the average power required by the integrated circuit. However, in some instances the peak power required by the integrated circuit will exceed the power which can be generated by a reasonably sized photovoltaic cell. In such a case it is desirable to provide a capacitor external to the integrated circuit to store charge and thereby smooth out the power requirements of the system and permit it to be powered by a photovoltaic cell. In such a case it is necessary to provide a means for attachment of this discrete component external to the integrated circuit device.

Figure 15:
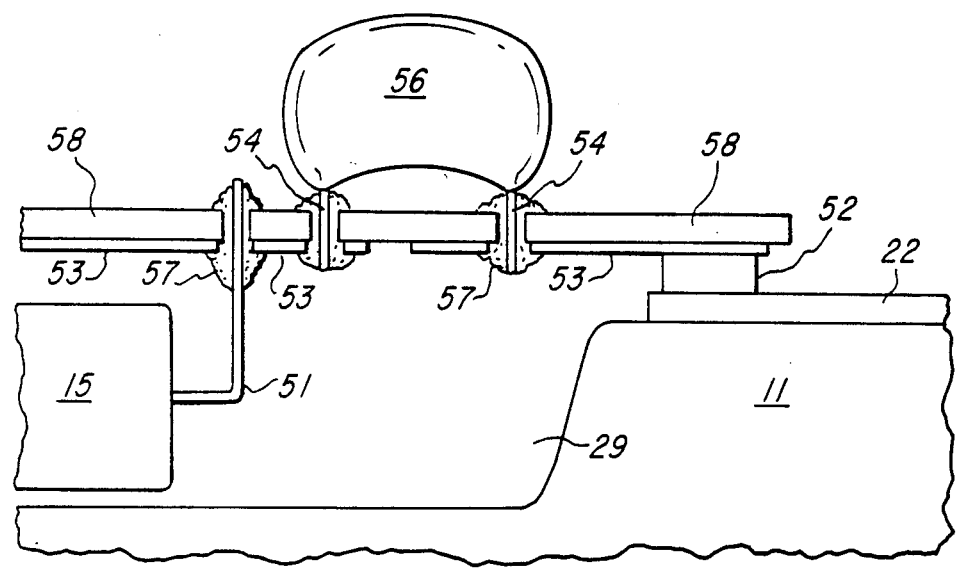
FIG. 15 illustrates an alternative embodiment for connection of an integrated circuit to the connector portion of the interconnection pattern.

FIG. 15 illustrates a preferred embodiment of the manner of connecting an integrated circuit and an external discrete component to the interconnection pattern 12 printed on bottom case 11. This technique includes the use of a small printed circuit board 58 to hold both the integrated circuit 15 and the discrete component.

FIG. 15 illustrates an embodiment of an integrated circuit 15 formed in a flat pack case. The cross sectional view of FIG. 15 shows lead 51 emerging from one end of integrated circuit 15 which passes through an aperture in printed circuit board 58. The lower surface of printed circuit board 58 includes a conductive printed pattern 53 constructed in a conventional manner. Integrated circuit lead 51 is electrically coupled to interconnection pattern 53 via solder 57 in accordance with known techniques.

FIG. 15 also illustrates external component 56, which may be a disk capacitor, mounted on printed circuit board 58. Capacitor 56 includes leads 54 which pass through apertures within the printed circuit board 58. These leads 54 are coupled to portions of interconnection pattern 53 via solder 57 in the same manner as the attachment of the integrated circuit leads 51. Although capacitor 56 is illustrated as mounted on the reverse side of printed circuit board 58 from the integrated circuit 15, these components may be mounted on the same side depending upon the clearance afforded by depression 29.

FIG. 15 illustrates bottom case 11 having depression 29 for mounting the combined structure attached to printed circuit board 58. Depression 29 has a depth so that integrated circuit 15 may be adhered to the bottom of depression 29 while providing a predetermined gap between interconnection pattern 53 mounted on the bottom side of printed circuit board 58 and conductor 22 of interconnection pattern 12 mounted on the top surface of bottom case 11. As in the case of mounting the dual in line package integrated circuit 15, a suitable mechanical adhesive is employed to attach integrated circuit 15 to an appropriate position in depression 29. A small amount of conductive adhesive 52, deposited in the same manner as illustrated in FIG. 6, serves to electrically couple the predetermined lines of interconnection pattern 53 and conductors 22. As noted above with respect to other components, the printed circuit board 58 may be secured via a pressure fit and connected via a conductive elastomeric interface as alternative embodiments.

Figure 16:
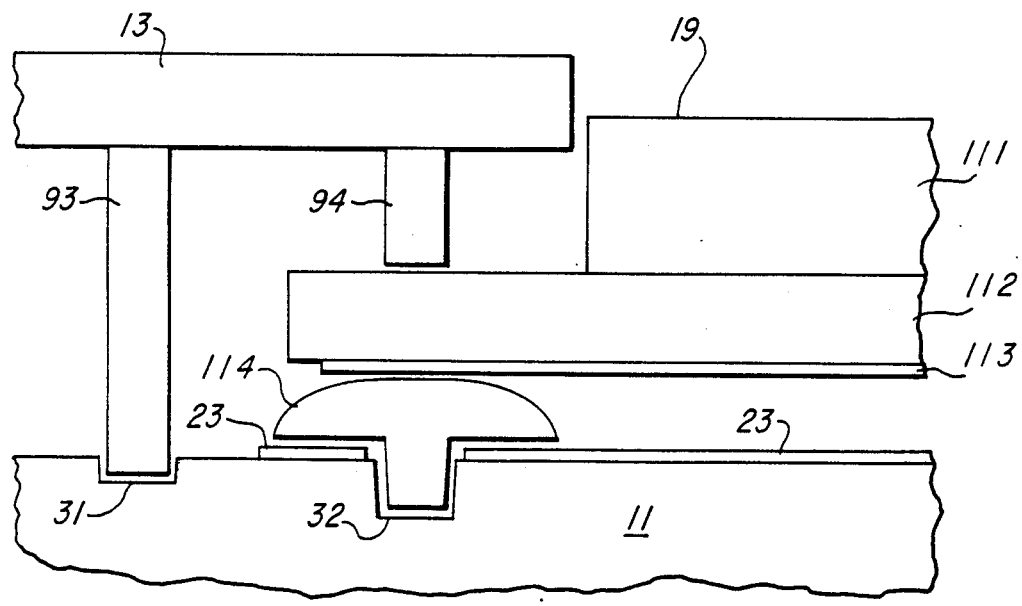
FIG. 16 illustrates the connection of a photovoltaic cell to the interconnection pattern in accordance with an alternative embodiment of the present invention.

FIG. 16 illustrates a preferred embodiment of the manner of mounting a photovoltaic cell within the electronic apparatus. FIG. 16 illustrates bottom case 11, top case 13 and photovoltaic cell 19.

Photovoltaic cell 19 includes a photovoltaic layer 111 which includes the electrical power generation circuit. This photovoltaic layer 111 is mounted on a back plate 112 which provides major mechanical support for the photovoltaic cell 19. Note that back plate 112 is disclosed as extending beyond the edge of photovoltaic layer 111. In the preferred embodiment an aperture is disposed within top case 13 sufficient to permit external ambient light to fall on photovoltaic layer 111. At the same time, the ends of back plate 112 extend beyond the dimensions of the aperture and enable mounting of the photovoltaic cell 19. FIG. 16 further illustrates electrical lead 113 disposed upon the lower surface of back plate 112.

FIG. 16 illustrates top case 13 which includes posts 93 and 94. In accordance with the matter illustrated in FIG. 10, post 93 is disposed in and received by power contact depression 31 within bottom case 11. As taught in conjunction with the matter illustrated in FIG. 10, post 93 may be disposed in this position to limit the lateral motion of photovoltaic cell 19. Post 94 is disposed in a position which substantially opposes a power contact depression 32 within bottom case 11. Post 94 has a height selected to engage the end of back plate 112 and substantially limit the vertical motion of photovoltaic cell 19.

The major electrical connection between photovoltaic cell 19 and interconnection pattern 12 is illustrated in FIG. 16. Interconnection pattern 12 disposed on bottom case 11 includes conductor 23 for connection to the voltage source. Disposed between conductor 23 and electrical terminal 113 of photovoltaic cell 19 is a mushroom shaped connector 114. This mushroom shaped connector 114 has a stem which extends into the depression 32 within bottom case 11. Connector 114 includes a crown portion whose bottom is placed in substantial contact with conductor 23 and whose top is placed in substantial contact with electrical lead 113. Connector 114 is preferably constructed of a conductive silicon rubber which is highly elastic.

The combination illustrated in FIG. 16 is assembled as follows. Firstly, the stem portion of connector 114 is disposed in the corresponding depression 32 within bottom case 11. Next photovoltaic cell 19 is placed on top of the connector 114 so that lead 113 is in substantial contact with the top of connector 114. Lastly, top case 13 is aligned and connected to bottom case 11. This preferably causes post 94 to press back plate 112 to slightly compress connector 114. This compression causes connector 114 to exert a force on both conductor 23 and lead 13, thereby electrically connecting these structures. It should be understood that FIG. 14 illustrates only one of at least two required connections for photovoltaic cell 19. Another connection of substantially the same type is preferably provided between photovoltaic cell 19 and the interconnection pattern 12 in order to provide a complete circuit.

What is claimed is:

1. A method for manufacture of an electronic apparatus comprising the steps of:

forming a first case part for said electronic apparatus having a non-conducting interior surface;

forming a conductive interconnection pattern on said non-conducting interior surface, said conductive interconnection pattern having at least one set of connection conductors including a plurality of conductors arranged in proximity about a predetermined region of said non-conducting interior surface and having a plurality of key switch positions, each key switch position having two conductors in proximity;

applying conductive adhesive material to said connection conductors of said set of connection conductors of said interconnection pattern at respective locations thereon in proximity to said predetermined region of said non-conducting interior surface;

disposing an integrated circuit semiconductor device having a plurality of outwardly extending leads within said predetermined region of said non-conducting interior surface with said leads extending outwardly of said predetermined region in spaced relation with said non-conducting interior surface of said first case part on which said conductive interconnection pattern is formed;

aligning the leads of said integrated circuit semiconductor device in registering partially overlapping spaced relationship with said set of connection conductors of said interconnection pattern so as to position the leads of said integrated circuit semiconductor device in respective abutment with the conductive adhesive material on the corresponding connection conductors of said set of connection conductors of said interconnection pattern such that said leads of said integrated circuit semiconductor device are electrically coupled to said set of connection conductors of said interconnection pattern in response to disposing said integrated circuit semiconductor device within said predetermined region of said non-conducting interior surface;

forming a second case part for said electronic apparatus having a plurality of keyholes therein positioned in registration with said plurality of key switch positions of said interconnection pattern;

disposing a key in each of said keyholes of said second case part, each key having a conductive portion for shorting together said two proximate conductors of a corresponding key switch position of said interconnection pattern and having a biasing means for normally preventing such shorting; and coupling together said first case part and said second case part.

2. A method as set forth in claim 1, wherein the forming of said first case part having said non-conducting interior surface includes forming a depression therein as said predetermined region for accommodating said integrated circuit semiconductor device at least partially therewithin; and the aligning of the leads of said integrated circuit semiconductor device in registering partially overlapping spaced relationship with said set of connection conductors of said interconnection pattern is accomplished by placing said integrated circuit semiconductor device in said depression by virtue of the relative dimensions of said integrated circuit semiconductor device and said depression to respectively electrically couple the leads of said integrated circuit semiconductor device to corresponding connection conductors of said set of connection conductors via the conductive adhesive material therebetween.

3. A method as set forth in claim 1, wherein the applying of conductive adhesive material to said connection conductors is accomplished by silk-screening portions of conductive adhesive material onto each of said connection conductors at the same time and at said respective locations thereon in proximity to said predetermined region of said non-conducting interior surface.

4. A method as set forth in claim 3, wherein the forming of said first case part having said non-conducting interior surface includes forming a depression therein as said predetermined region of accommodating said integrated circuit semiconductor device at least partially therewithin; and the aligning of the leads of said integrated circuit semiconductor device in registering partially overlapping spaced relationship with said set of connection conductors of said interconnection pattern is accomplished by placing said integrated circuit semiconductor device in said depression by virtue of the relative dimensions of said integrated circuit semiconductor device and said depression to respectively electrically couple the leads of said integrated circuit semiconductor device to corresponding connection conductors of said set of connection conductors via the conductive adhesive material therebetween.

5. A method as set forth in claim 1, wherein the applying of conductive adhesive material to said connection conductors is accomplished by mask printing portions of conductive adhesive material onto each of said connection conductors at the same time and at said respective locations thereon in proximity to said predetermined region of said non-conducting interior surface.

6. A method as set forth in claim 5 wherein the forming of said first case part having said non-conducting interior surface includes forming a depression therein as said predetermined region for accommodating said integrated circuit semiconductor device at least partially therewithin; and the aligning of the leads of said integrated circuit semiconductor device in registering partially overlapping spaced relationship with said set of connection conductors of said interconnection pattern is accomplished by placing said integrated circuit semiconductor device in said depression by virture of the relative demensions of said integrated circuit semiconductor device and said depression to respectively electrically couple the leads of said integrated circuit semiconductor device to corresponding connection conductors of said set of connection conductors via the conductive adhesive material therebetween.

7. A method for manufacture of an electronic apparatus comprising the steps of:

forming a first case part for electronic apparatus having a non-conducting interior surface provided with a depression therein for accommodating an integrated circuit semiconductor device;

forming a conductive interconnection pattern on said non-conducting interior surface, said conductive interconnection pattern having first, second and third sets of connection conductors, each set including a plurality of conductors, said first set of connection conductors being disposed in proximity to said depression and having a plurality of key switch positions, each key switch position having two conductors in proximity;

applying conductive adhesive material to at least said connection conductors of said first set of connection conductors of said interconnection pattern at respective locations thereon in proximity to said depression;

disposing an integrated circuit semiconductor device having a plurality of outwardly extending leads at least partially within said depression with said leads extending outwardly of said depression into spaced relation with said non-conducting interior surface of said first case part on which said conductive interconnection pattern is formed;

aligning the leads of said integrated circuit semiconductor device in registering partially overlapping spaced relationship with said first set of connection conductors of said interconnection pattern so as to position the leads of said integrated circuit semiconductor device in respective abutment with the conductive adhesive material on the corresponding connection conductors of said first set of connection conductors of said interconnection pattern such that said leads of said integrated circuit semiconductor device are electrically coupled to said first set of connection conductors of said interconnection pattern in response to disposing said integrated circuit semiconductor device at least partially within said depression by virtue of the relative dimensions of said integrated circuit semiconductor device and said depression;

electrically coupling an output device to said second set of connection conductors of said interconnection pattern;

electrically coupling a power source to said third set of connection conductors of said interconnection pattern;

forming a second case part for said electronic apparatus having an opening therein positioned for registration with said output device and a plurality of keyholes therein positioned for registration with said plurality of key switch positions of said interconnection pattern;

disposing a key in each of said keyholes of said second case part, each key having a conductive portion for shorting together said two proximate conductors of a corresponding key switch position of said interconnection pattern and having a biasing means for normally preventing such shorting; and coupling together said first case part and said second case part.

8. A method for manufacture of an electronic apparatus comprising the steps of:

forming a first case part for said electronic apparatus having a non-conducting interior surface provided with a depression therein for accommodating an output device;

forming a conductive interconnection pattern on said non-conducting interior surface, said conductive interconnection pattern having first, second and third sets of connection conductors, each set including a plurality of conductors, said first set of connection conductors having a plurality of key switch positions, each key switch position having two conductors in proximity, and said second set of connection conductors being disposed in proximity to said depression;

applying conductive adhesive material to at least said connection conductors of said first and second sets of connection conductors of said interconnection pattern at respective locations thereon, the conductive adhesive material being applied to said second set of connection conductors at locations in proximity to said depression;

disposing an integrated circuit semiconductor device having a plurality of outwardly extending leads within a predetermined region of said non-conducting interior surface with said leads extending outwardly of said predetermined region into spaced relation with said non-conducting interior surface of said first case part on which said conductive interconnection pattern is formed;

aligning the leads of said integrated circuit semiconductor device in registering partially overlapping spaced relationship with said first set of connection conductors of said interconnection pattern so as to position the leads of said integrated circuit semiconductor device in respective abutment with the conductive adhesive material on the corresponding connection conductors of said first set of connection conductors of said interconnection pattern such that said leads of said integrated circuit semiconductor device are electrically coupled to said first set of connection conductors of said interconnection pattern;

disposing an output device having leads at least partially within said depression with the leads extending outwardly of the depression into spaced relation with said non-conducting interior surface of said first case part on which said conductive interconnection pattern is formed;

aligning the leads of said output device in registering partially overlapping spaced relationship with said second set of connection conductors of said interconnection pattern so as to position the leads of said output device in respective abutment with the conductive adhesive material on the corresponding connection conductors of said second set of connection conductors of said interconnection pattern such that said leads of said output device are electrically coupled to said second set of connection conductors of said interconnection pattern in response to disposing said output device at least partially within said depression by virtue of the relative dimensions of said output device and said depression;

electrically coupling a power source to said third set of connection conductors of said interconnection pattern;

forming a second case part for said electronic apparatus having an opening therein positioned for registration with said output device and a plurality of keyholes therein positioned for registration with said plurality of key switch positions of said interconnection pattern; p1 disposing a key in each of said keyholes of said second case part, each key having a conductive portion for shorting together said two proximate conductors of a corresponding key switch position of said interconnection pattern and having a biasing means for normally preventing such shorting; and coupling together said first case part and said second case part.

9. A method for manufacture of an electronic apparatus comprising the steps of:

forming a first case part for said electronic apparatus having non-conducting interior surface provided with a depression therein for accommodating an integrated circuit semiconductor device;

forming a conductive interconnection pattern on said non-conducting interior surface, said conductive interconnection pattern having first, second and third sets of connection conductors, each set including a plurality of conductors, said first set of connection conductors being disposed in proximity to said depression and having a plurality of key switch positions, each key switch position having two conductors in proximity;

applying conductive adhesive material to at least said connection conductors of said first set of connection conductors of said interconnection pattern at respective locations thereon in proximity to said depression;

forming a circuit pattern on a circuit board, said circuit pattern having first and second connection conductors;

providing an integrated circuit semiconductor device having a plurality of leads extending upwardly therefrom;

mounting said circuit board on said integrated circuit semiconductor device by electrically coupling the leads of said integrated circuit semiconductor device to said first connection conductors of said circuit board;

disposing said integrated circuit semiconductor device at least partially within said depression with said circuit board mounted thereon so as to dispose said second connection conductors of said circuit board in spaced relation with non-conducting interior surface of said first case part on which said conductive interconnection pattern is formed;

aligning said second connection conductors of said circuit board in registering partially overlapping spaced relationship with said first set of connection conductors of said interconnection pattern so as to position said second connection conductors of said circuit board in respective abutment with the conductive adhesive material on the corresponding connection conductors of said first set of connection conductors of said interconnection pattern such that said second connection conductors of said circuit board are electrically coupled to said first sert of connection conductors of said interconnection pattern;

electrically coupling an output device to said second set of connection conductors of said interconnection pattern;

electrically coupling a power source to said third set of connection conductors of said interconnection pattern;

forming a second case part for said electronic apparatus having an opening therein positioned for registration with said output device and a plurality of keyholes therein positioned for registration with said plurality of key switch positions of said interconnection pattern;

disposing a key in each of said keyholes of said second case part, each key having a conductive portion for shorting together said two proximate conductors of a corresponding key switch position of said interconnection pattern and having a biasing means for normally preventing such shorting; and coupling together said first case part and said second case part.

10. A method as set forth in claim 9, further including electrically attaching at least one discrete electrical component to said first connection conductors of said circuit board.

11. A method for manufacture of an electronic apparatus comprising the steps of:

forming an exterior case for said electronic apparatus having at least one non-conducting interior surface provided with a depression therein for accommodating an integrated circuit semiconductor device;

forming a conductive interconnection pattern on said non-conducting interior surface, said conductive interconnection pattern having first, and second and third sets of connection conductors, each set including a plurality of conductors, said first set of connection conductors being disposed in proximity to said depression;

applying conductive adhesive material to at least said connection conductors of said first set of connection conductors of said interconnection pattern at respective locations thereon in proximity to said depression;

disposing an integrated circuit semiconductor device having a plurality of outwardly extending leads at least partially within said depression with said leads extending outwardly of said depression into spaced relation with said non-conducting interior surface of said case on which said conductive interconnection pattern is formed;

aligning the leads of said integrated circuit semiconductor device in registering partially overlapping spaced relationship with said first set of connection conductors of said interconnection pattern so as to position the leads of said integrated circuit semiconductor device in respective abutment with the conductive adhesive material on the corresponding connection conductors of said first set of connection conductors of said interconnection pattern such that said leads of said integrated circuit semiconductor device are electrically coupled to said first set of connection conductors of said interconnection pattern in response to disposing said integrated circuit semiconductor device at least partially within said depression by virtue of the relative dimensions of said integrated circuit semiconductor device and said depression;

electrically coupling an output device to said second set of connection conductors of said interconnection pattern; and electrically coupling a power source to said third set of connection conductors of said interconnection pattern.

12. A method for manufacture of an electronic apparatus comprising the steps of:

forming an exterior case for said electronic apparatus having at least one non-conducting interior surface provided with a depression therein for accommodating an output device;

forming a conductive interconnection pattern on said non-conducting interior surface, said conductive interconnection pattern having first, second and third sets of connection conductors, each set including a plurality of conductors, said second set of connection conductors being disposed in proximity to said depression;

applying conductive adhesive material to at least said connection conductors of said first and second sets of connection conductors of said interconnection pattern at respective locations thereon, the conductive adhesive material being applied to said second set of connection conductors at locations in proximity to said depression;

disposing an integrated circuit semiconductor device having a plurality of outwardly extending leads within a predetermined region of said non-conducting interior surface with said leads extending outwardly of said predetermined region into spaced relation with said non-conducting interior surface of said case on which said conductive interconnection pattern is formed;

aligning the leads of said integrated circuit semiconductor device in registering partially overlapping spaced relationship with said first set of connection conductors of said interconnection pattern so as to position the leads of said integrated circuit semiconductor device in respective abutment with the conductive adhesive material on the corresponding connection conductors of said first set of connection conductors of said interconnection pattern such that said leads of said integrated circuit semiconductor device are electrically coupled to said first set of connection conductors of said interconnection pattern;

disposing an output device having leads at least partially within said depression with the leads extending outwardly of the depression into spaced relation with said non-conducting interior surface of said case on which said conductive interconnection pattern is formed;

aligning the leads of said output device in registering partially overlapping spaced relationship with said second set of connection conductors of said interconnection pattern so as to position the leads of said output device in respective abutment with the conductive adhesive material on the corresponding connection conductors of said second set of connection conductors of said interconnection pattern such that said leads of said output device are electrically coupled to said second set of connection conductors of said interconnection pattern in response to disposing said output device at least partially within said depression by virtue of the relative dimensions of said output device and said depression; and electrically coupling a power source to said third set of connection conductors of said interconnection pattern.

13. A method for manufacture of an electronic apparatus comprising the steps of:

forming an exterior case for said electronic apparatus having at least one non-conducting interior surface provided with a depression therein for accommodating an integrated circuit semiconductor device;

forming a conductive interconnection pattern on said non-conducting interior surface, said conductive interconnection pattern having first, second and third sets of connection conductors, each set including a plurality of conductors, said first set of connection conductors being disposed in proximity to said depression;

applying conductive adhesive material to at least said connection conductors of said first set of connection conductors of said interconnection pattern at respective locations thereon in proximity to said depression;

forming a circuit pattern on a circuit board, said circuit pattern having first and second connection conductors;

providing an integrated circuit semiconductor device having a plurality of leads extending upwardly therefrom;

mounting said circuit board on said integrated circuit semiconductor device by electrically coupling the leads of said integrated circuit semiconductor device to said first connection conductors of said circuit board;

disposing said integrated circuit semiconductor device at least partially within said depression with said circuit board mounted thereon so as to dispose said second connection conductors of said circuit board in spaced relation with said non-conducting interior surface of said case on which said conductive interconnection pattern is formed;

aligning said second connection conductors of said circuit board in registering partially overlapping spaced relationship with said first set of connection conductors of said interconnection pattern so as to position said second connection conductors of said circuit board in respective abutment with the conductive adhesive material on the corresponding connection conductors of said first set of connection conductors of said interconnection pattern such that said second connection conductors of said circuit board are electrically coupled to said first set of connection conductors of said interconnection pattern;

electrically coupling an output device to said second set of connection conductors of said interconnection pattern; and electrically coupling a power source to said third set of connection conductors of said interconnection pattern.

14. A method as set forth in claim 13, further including electrically attaching at least one discrete electrical component to said first connection conductors of said circuit board.

* * * * *